(12) United States Patent
Cheng

(10) Patent No.: US 11,694,743 B2
(45) Date of Patent: Jul. 4, 2023

(54) CHIP AND ASSOCIATED CHIP SYSTEM

(71) Applicant: Realtek Semiconductor Corp., HsinChu (TW)

(72) Inventor: Ching-Sheng Cheng, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 152 days.

(21) Appl. No.: 17/340,062

(22) Filed: Jun. 6, 2021

(65) Prior Publication Data

US 2022/0068344 A1    Mar. 3, 2022

(30) Foreign Application Priority Data

Sep. 2, 2020   (TW) .................................. 109130067

(51) Int. Cl.
G11C 16/04     (2006.01)
G11C 11/408    (2006.01)
G06F 13/42     (2006.01)

(52) U.S. Cl.
CPC ........ G11C 11/408 (2013.01); G06F 13/4221 (2013.01)

(58) Field of Classification Search
CPC ............................. G11C 11/408; G11C 11/409
See application file for complete search history.

(56) References Cited

U.S. PATENT DOCUMENTS

| 7,016,213 B2 * | 3/2006 | Reeves ............... G06F 12/0215 710/22 |
| 2007/0008763 A1 * | 1/2007 | Choi ....................... G11C 8/12 365/63 |
| 2008/0030221 A1 * | 2/2008 | Lee ..................... H04L 25/0278 326/30 |

FOREIGN PATENT DOCUMENTS

TW       201224762 A1    6/2012

* cited by examiner

Primary Examiner — Pho M Luu
(74) Attorney, Agent, or Firm — Winston Hsu

(57) ABSTRACT

A chip system includes a first chip, a first DRAM, a second chip and a second DRAM. The first chip includes a first DRAM controller and a first serial transmission interface. The first DRAM is coupled to the first DRAM controller. The second chip includes a second DTAM controller and a second serial transmission interface. The second serial transmission interface is coupled to the first serial transmission interface. The second DRAM is coupled to the second DRAM controller. When the first chip intends to store first data and second data, the first chip stores the first data into the first DRAM via the first DRAM controller, and transmits the second data to the second chip via the first serial transmission interface; and the second chip stores the second data into the second DRAM via the second DRAM controller.

13 Claims, 2 Drawing Sheets

CHIP AND ASSOCIATED CHIP SYSTEM

BACKGROUND OF THE INVENTION

1. Field of the Invention

The present invention relates to a chip system, and more particularly, to a chip system with a dynamic random access memory (DRAM).

2. Description of the Prior Art

A double data rate (DDR) dynamic random access memory (DRAM) is a memory with a high-speed multi-bit parallel transmission interface. Considering that the parallel transmission interface has more connection points/pins and transmission lines, a single chip has only one DDR interface circuit. However, since a single chip has only one DDR interface circuit, a bandwidth of this DDR interface circuit limits the applications and capabilities of the chip and the associated system.

SUMMARY OF THE INVENTION

One of the objectives of the present invention is to provide a system with multiple chips, wherein a single chip can request access to a double data rate (DDR) dynamic random access memory (DRAM) of another chip through a serial transmission interface, so as to effectively expand the bandwidth of the chip without additional DDR interface circuit(s), to solve problems of the prior art.

An embodiment of the present invention discloses a chip system including a first chip, a first DRAM, a second chip and a second DRAM. The first chip includes a DRAM controller and a first serial transmission interface. The first DRAM is coupled to the first DRAM controller of the first chip. The second chip includes a second DRAM controller and a second serial transmission interface. The second serial transmission interface is coupled to the first serial transmission interface. The second DRAM is coupled to the second DRAM controller of the second chip. When the first chip intends to store first data and second data, the first chip stores the first data into the first DRAM via the first DRAM controller, and transmits the second data to the second chip via the first serial transmission interface. And the second chip stores the second data into the second DRAM via the second DRAM controller.

An embodiment of the present invention further discloses a chip including a core circuit, a DRAM controller and a serial transmission interface. The (DRAM) controller is coupled to a DRAM. The serial transmission interface is coupled to another chip. When the core circuit intends to store first data and second data, the core circuit stores the first data into the DRAM via the DRAM controller, and transmits the second data to said another chip via the serial transmission interface, such that said another chip stores the second data into another DRAM which can be accessed by said another chip.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
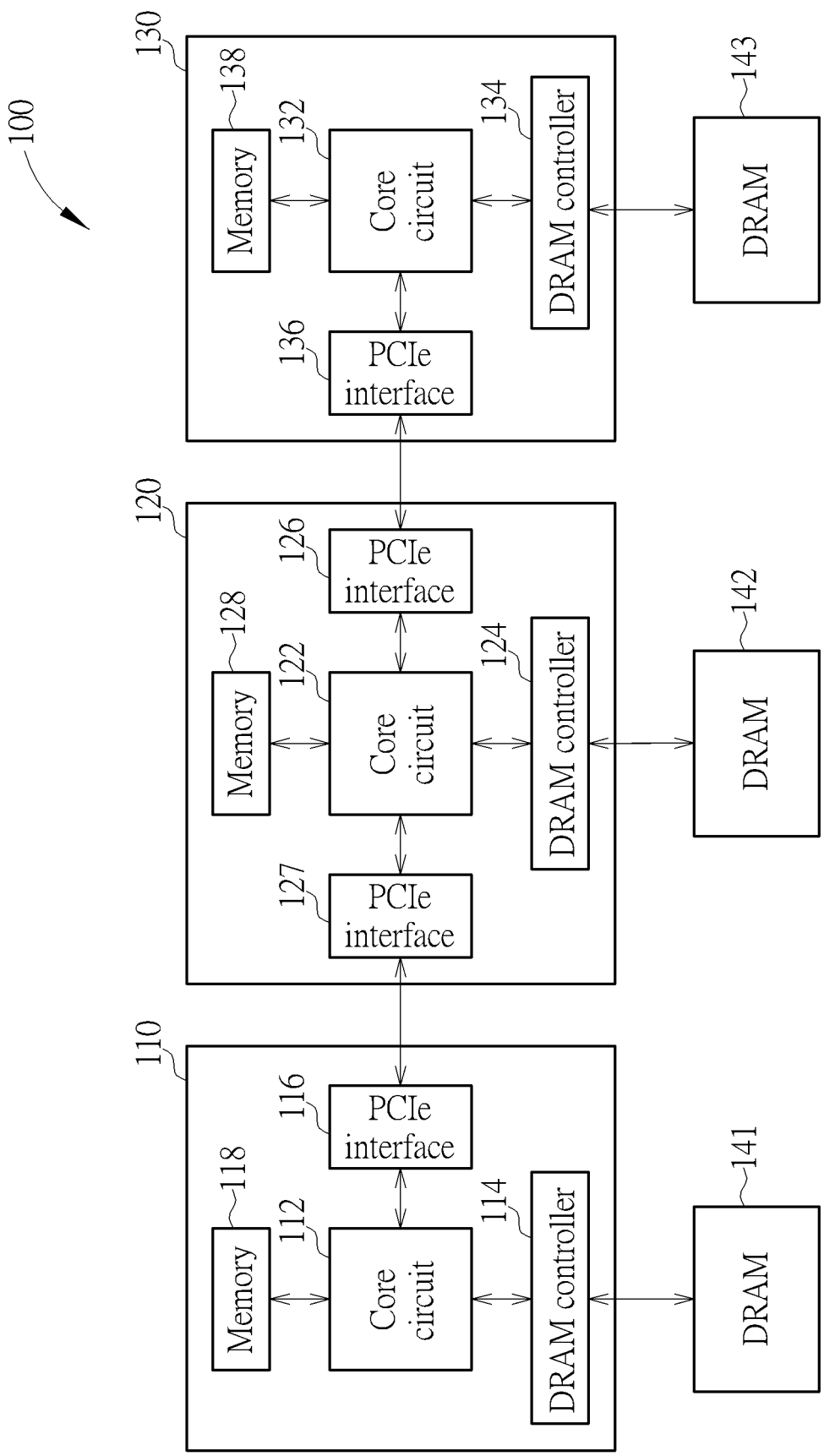
FIG. 1 is a diagram illustrating a chip system according to an embodiment of the present invention.

FIG. 1 is a diagram illustrating a chip system 100 according to an embodiment of the present invention. As shown in FIG. 1, the chip system 100 includes three chips 110, 120 and 130 and three DRAMs 141, 142 and 143. The chip 110 includes a core circuit 112, a DRAM controller 114, a serial transmission interface (in this embodiment, the serial transmission interface is a peripheral component interconnect express (PCIe) interface 116) and a memory 118; the chip 120 includes a core circuit 122, a DRAM controller 124, two PCIe interfaces 126, 127, and a memory 128; the chip 130 includes a core circuit 132, a DRAM controller 134, a PCIe interface 136, and a memory 138. In this embodiment, the chips 110, 120 and 130 can be any chips each having a DRAM controller, such as central processing units (CPUs), graphics processing units (GPUs), or any other chips with specific or general function. In addition, it should be noticed that, in other embodiments, the serial transmission interface is not limited to the PCIe interface, and can be any transmission interface providing an equivalent bandwidth.

In the present embodiment, the chip 110 includes only a single DRAM controller 114, that is, the chip 110 includes only one DDR interface circuit. The chip 110 can only directly access the DRAM 141, and cannot directly access other DRAMs. However, the present invention is not limited thereto. In addition, the chip 120 includes only a single DRAM controller 124, and the chip 130 also includes only a single DRAM controller 134. However, the present invention is not limited thereto.

In the embodiment shown in FIG. 1, the chip 110 includes only one DRAM controller 114 and can only directly access the DRAM 141. To prevent the function and application of the chip 110 from being limited by the bandwidth of the DRAM controller 114 and the DRAM 141, the chip 110 in this embodiment can regard the DRAMs 142 and 143 that can be directly accessed by the chip 120 and 130 as its own virtual memory. In other words, the chip 110 can access the DRAMs 142 and 143 through the chips 120 and 130 to expand its bandwidth.

Specifically, when the chip 110 intends to write three pieces of data to the DRAM, the core circuit 112 can directly write the first piece of data to the DRAM 141 through the DRAM controller 114; in addition, the chip 110 transmits the second and third pieces of data to the chip 120 through the PCIe interface 116. After the core circuit 122 of the chip 120 receives the second and third pieces of data from the chip 110 through the PCIe interface 127, the core circuit 122 can directly write the second piece of data to the DRAM 142 through the DRAM controller 124, and transmits the third piece of data to the chip 130 through the PCIe interface 126. After the core circuit 132 of the chip 130 receives the third piece of data from the chip 120 through the PCIe interface 136, the core circuit 132 can directly write the third piece of data to the DRAM 143 through the DRAM controller 134. As mentioned above, by using the PCIe interface 116 to transfer part of the data to the chips 120 and 130 and writing the data to the DRAMs 142 and 143 corresponding to the chips 120 and 130 respectively, the storage space and bandwidth of the chip 110 can be effectively increased.

In the present embodiment, the chip 110 can write its data to the DRAMs 142 and 143 corresponding to the chips 120 and 130 respectively through address extension or address mapping. Assuming that the first, second, and third pieces of data of the chip 110 have addresses (logical addresses) LBA1, LBA2, and LBA3, the core circuit 112 can create a lookup table in the memory 118, where the lookup table can record that the first piece of data with address LBA1 is stored in the DRAM 141, and the second and third pieces of data with the addresses LBA2 and LBA3 respectively are stored in other chips. The core circuit 122 of chip 120 also creates a lookup table in the memory 128, where the lookup table can record that the second piece of data with the address LBA2 is stored in the DRAM 142, and the third piece of data with the address LBA3 is stored in the chip 130.

When the chip 110 needs to access the first, second, and third pieces of data previously written to the DRAMs 141, 142 and 143, the core circuit 112 firstly refers to the lookup table stored in the memory 118 to determine that the first piece of data is stored in the DRAM 141 which can be directly accessed, and further determine that the second and third data are stored in other chips. At this moment, the core circuit 112 transmits the address LBA1 of the first piece of data to the DRAM controller 114 for enabling the DRAM controller 114 to read the first piece of data from the DRAM 141 according to the internal address mapping mechanism, and the core circuit 112 additionally sends a read command in order to transmit the addresses LBA2 and LBA3 of the second and third pieces of data to the chip 120 through the PCIe interface 116. After the chip 120 receives the addresses LBA2 and LBA3, the core circuit 122 firstly refers to the lookup table stored in the memory 128 to determine that the second piece of data is stored in the DRAM 142 which can be directly accessed, and further determine that the third piece of data is stored in the chip 130. At this moment, the core circuit 122 transmits the address LBA2 of the second piece of data to the DRAM controller 124 for enabling the DRAM controller 124 to read the second piece of data from the DRAM 142 according to the internal address mapping mechanism, and the core circuit 122 additionally transmits the address LBA3 of the third piece of data to the chip 130 through the PCIe interface 126. In addition, after the second piece of data is read, the core circuit 122 immediately transmits the second piece of data to the chip 110 through the PCIe interface 127. Then, after the chip 130 receives the address LBA3, the core circuit 122 transmits the address LBA3 of the third piece of data to the DRAM controller 134 for enabling the DRAM controller 134 to read the third piece of data from the DRAM 143 according to the internal address mapping mechanism, and immediately transmits the third piece of data to the chip 120 through the PCIe interface 136. In addition, after the third piece of data is received from the chip 130, the core circuit 122 immediately transmits the third piece of data to the chip 110 through the PCIe interface 127.

In one embodiment, the chip 110 simultaneously receives the first piece of data from the DRAM 141 and receives the second piece of data from the chip 120 during a partially overlapping time period, in order to quickly obtain the first piece of data and the second piece of data.

As mentioned above, the DRAMs 141, 142 and 143 can all be regarded as the memories that can be accessed by the chip 110. Furthermore, the current PCIe fifth-generation serial transmission speed can reach 64 Gb/s (gigabits per second). Therefore, by simultaneously using the DDR interface and the PCIe interface to transmit data, the bandwidth of the chip 110 can be greatly increased. In addition, since the PCIe interface 116 using serial transmission has fewer data transmission lines, the chip area for the chip 110 is reduced.

It should be noticed that the number of chips in the chip system 100 shown in FIG. 1 is only an example and not a limitation of the present invention. Specifically, the chip system 100 may include only two chips. That is, the chip 130, the DRAM 143 and the PCIe interface 126 in FIG. 1 can be removed from the diagram without affecting the essential operation of the present invention. In addition, the chip system 100 may also include a fourth chip and a DRAM that can only be directly accessed by the fourth chip and can be used as a virtual memory of the chip 110. These alternative designs all belong to the scope of the present invention In addition, an embodiment shown in FIG. 1 takes the PCIe interface as an example. However, in other embodiments, the PCIe interfaces 116, 126, 127 and 136 can be replaced with transmission interfaces of other specifications, such as Universal Serial Bus (USB) interfaces.

Figure 2:
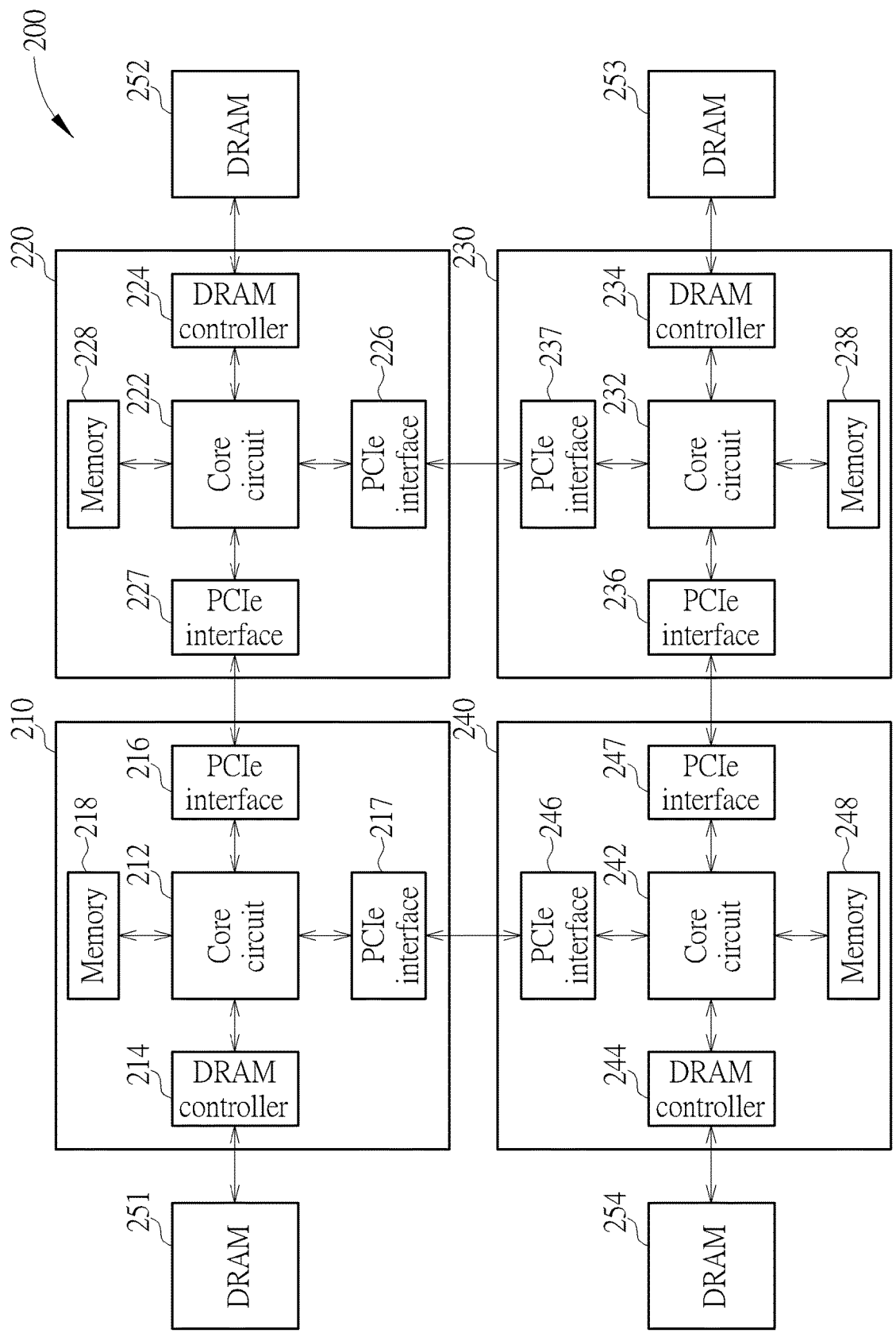
FIG. 2 is a diagram illustrating a chip system according to another embodiment of the present invention.

FIG. 2 is a diagram illustrating a chip system 100 according to another embodiment of the present invention. As shown in FIG. 2, the chip system 200 includes four chips 210, 220, 230 and 240 and four DRAMs 251, 252, 253 and 254. The chip 210 includes a core circuit 212, a DRAM controller 214, and two serial transmission interfaces (in the present embodiment, the two serial transmission interfaces are PCIe interfaces 216 and 217) and a memory 218; the chip 220 includes a core circuit 222, a DRAM controller 224, two PCIe interfaces 226 and 227 and a memory 228; the chip 230 includes a core circuit 232, a DRAM controller 234, two PCIe interfaces 236 and 237 and a memory 238; the chip 240 includes a core circuit 242, a DRAM controller 244, two PCIe interfaces 246 and 247, and a memory 248. In the present embodiment, the chips 210, 220, 230 and 240 can be any chips each having a DRAM controller, such as central processing units, graphics processing units, or any other chips with specific or general function.

In the present embodiment, each of the chips 210, 220, 230 and 240 includes only a single DRAM controller. That is, each of the chips 210, 220, 230 and 240 can only directly access a corresponding DRAM, but cannot directly access other DRAMs.

In the embodiment of FIG. 2, each of the chips 210, 220, 230 and 240 includes only a single DRAM controller. In order to prevent the functions and applications of the chips 210, 220, 230 and 240 from being restricted by the bandwidth of the DRAMs, the chips 210, 220, 230 and 240 in this embodiment can all regard the DRAMs 251, 252, 253 and 254 illustrated in FIG. 2 as their own virtual memory. That is, each of the chips 210, 220, 230 and 240 can access other DRAMs through other chips to expand its bandwidth.

Specifically, when the chip 210 needs to write three pieces of data to the DRAM, the core circuit 212 can directly write the first piece of data to the DRAM 241 through the DRAM controller 214; in addition, the chip 210 transmits the second and third pieces of data to the chips 220 and 240 through the PCIe interfaces 216 and 217 respectively. After the core circuit 222 of the chip 220 receives the second piece of data from the chip 210 through the PCIe interface 227, the core circuit 222 can directly write the second piece of data to the DRAM 252 through the DRAM controller 224. After the core circuit 242 of the chip 240 receives the third piece of data from the chip 210 through the PCIe interface 246, the core circuit 242 can directly write the third piece of data to the DRAM 254 through the DRAM controller 244. As described above, the PCIe interfaces 216 and 217 are used to transmit part of the data to the chips 220 and 240, and the data are written to the DRAMs 252 and 254 corresponding to the chips 220 and 240, respectively.

In the present embodiment, the chip 210 can write its own data of the chip 210 to the DRAMs 252 and 254 corresponding to the chips 220 and 240 respectively through address extension or address mapping. For example, assuming that the first, second and third pieces of data of the chip 210 have addresses (logical addresses) LBA1, LBA2 and LBA3, the core circuit 112 can create a lookup table in the memory 218, where the lookup table can record that the first piece of data with the address LBA1 is stored in the DRAM 251, and the second and third pieces of data with addresses LBA2 and LBA3 are stored in the chips 220 and 240 respectively.

When the chip 210 needs to access the first, second, and third piece of data previously written to the DRAMs 251, 252 and 254, the core circuit 212 firstly refers to the lookup table stored in the memory 218 to determine that the first piece of data is stored in the DRAM 251 which can be directly accessed, and further determine that the second and third pieces of data are stored in the chips 220 and 240 respectively. At this moment, the core circuit 212 transmits the address LBA1 of the first piece of data to the DRAM controller 214 for enabling the DRAM controller 214 to read the first piece of data from the DRAM 251 according to the internal address mapping mechanism, and additionally sends read commands to transmit the addresses LBA2 and LBA3 of the second and third pieces of data to the chips 220 and 240 through the PCIe interfaces 216 and 217, respectively. After the chip 220 receives the address LBA2, the core circuit 222 transmits the address LBA2 of the second piece of data to the DRAM controller 224 for enabling the DRAM controller 224 to read the second piece of data from the DRAM 252 according to the internal address mapping mechanism, and immediately transmits the second piece of data to the chip 210 through the PCIe interface 227. In addition, after the chip 240 receives the address LBA3, the core circuit 242 transmits the address LBA3 of the third piece of data to the DRAM controller 244 for enabling the DRAM controller 244 to read the third piece of data from the DRAM 254 according to the internal address mapping mechanism, and immediately transmits the third piece of data to the chip 210 through the PCIe interface 246.

It should be noticed that the above description is based on the assumption that chip 210 needs to write data to the DRAM. However, each of the chips 220, 230 and 240 in FIG. 2 can also write its own data to the DRAMs of other chips through the above mechanism. For example, the chip 230 can transmit its own data to chips 220 and 240 through the PCIe interfaces 236 and 237, for being stored in DRAMs 252 and 254 respectively.

As mentioned above, the DRAM 251, 252, 253 and 254 can all be regarded as memories that can be accessed by the chips 210, 220, 230 and 240. Therefore, by using both DDR interface and PCIe interface to transmit data, the bandwidth of each of the chips 210, 220, 230 and 240 can be greatly increased. In addition, since the PCIe interface of serial transmission has fewer data transmission lines, the chip area for the chips 210, 220, 230 and 240 is greatly reduced.

It should be noticed that the number of chips in the chip system 200 shown in FIG. 2 is only an example and not a limitation of the present invention. Specifically, the chip system 200 may include only three chips. For example, the chip 230 and the DRAM 253 in FIG. 2 can be removed from the diagram, and the PCIe interface 226 of the chip 220 can be connected to the PCIe interface 247 of the chip 240. In addition, part of the chips in the chip system 200, such as the chip 210, may include more PCIe interfaces for connecting to more chips, in order to expand its bandwidth more significantly. These alternative designs all belong to the scope of the present invention Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A chip system, comprising:
   a first chip, comprising a first dynamic random access memory (DRAM) controller and a first serial transmission interface;
   a first DRAM, coupled to the first DRAM controller of the first chip;
   a second chip, comprising a second DRAM controller and a second serial transmission interface, wherein the second serial transmission interface is coupled to the first serial transmission interface; and
   a second DRAM, coupled to the second DRAM controller of the second chip;
   wherein when the first chip intends to store first data and second data, the first chip stores the first data into the first DRAM via the first DRAM controller, and transmits the second data to the second chip via the first serial transmission interface; and the second chip stores the second data into the second DRAM via the second DRAM controller.

2. The chip system of claim 1, wherein the first chip does not include other DRAM controllers except the first DRAM controller, and the first DRAM controller only directly accesses the first DRAM.

3. The chip system of claim 1, wherein the first serial transmission interface is a Peripheral Component Interconnect Express (PCIe) interface.

4. The chip system of claim 1, wherein the first chip further comprises a memory, the memory comprises a lookup table, and the lookup table records that an address of the first data corresponds to the first DRAM or the first chip, and an address of the second data corresponds to the second chip.

5. The chip system of claim 1, wherein when the first chip intends to read the first data and the second data, the first chip reads the first data from the first DRAM via the first DRAM controller; and the first chip transmits a read command to the second chip via the first serial transmission interface, wherein the read command comprises an address of the second data, such that the second chip reads the second data from the second DRAM via the second DRAM controller, and transmits the second data to the first chip via the second serial transmission interface.

6. The chip system of claim 5, wherein the first chip simultaneously receives the first data from the first DRAM and receives the second data from the second chip during a partially overlapping time period.

7. The chip system of claim 1, wherein the second chip further comprises another second serial transmission interface, and the chip system further comprises:
   a third chip, comprising a third DRAM controller and a third serial transmission interface, wherein the third serial transmission interface is coupled to said another second serial transmission interface; and
   a third DRAM, coupled to the third DRAM controller of the third chip;
   wherein when the first chip intends to store third data, the first chip transmits the third data to the second chip via the first serial transmission interface, and the second chip transmits the third data to the third chip via said another second serial transmission interface, and the third chip stores the third data into the third DRAM via the third DRAM controller.

8. The chip system of claim 1, wherein the first chip further comprises another first serial transmission interface, and the chip system further comprises:
- a third chip, comprising a third DRAM controller and a third serial transmission interface, wherein the third serial transmission interface is coupled to said another first serial transmission interface; and
- a third DRAM, coupled to the third DRAM controller of the third chip;
- wherein when the first chip intends to store the first data, the second data and third data, the first chip stores the first data into the first DRAM via the first DRAM controller, transmits the second data to the second chip via the first serial transmission interface, and transmits the third data to the third chip via said another first serial transmission interface; and the second chip stores the second data into the second DRAM via the second DRAM controller, and the third chip stores the third data into the third DRAM via the third DRAM controller.

9. A chip, comprising:
- a core circuit;
- a dynamic random access memory (DRAM) controller, coupled to a DRAM; and
- a serial transmission interface, coupled to another chip;
- wherein when the core circuit intends to store first data and second data, the core circuit stores the first data into the DRAM via the DRAM controller, and transmits the second data to said another chip via the serial transmission interface, such that said another chip stores the second data into another DRAM which is accessible to said another chip;
- wherein the chip further comprises a memory, the memory comprises a lookup table, and the lookup table records that an address of the first data corresponds to the DRAM or the chip, and an address of the second data corresponds to said another chip.

10. The chip of claim 9, wherein the chip does not include other DRAM controllers except the DRAM controller, and the DRAM controller only directly accesses the DRAM.

11. The chip of claim 9, wherein the serial transmission interface is a Peripheral Component Interconnect Express (PCIe) interface.

12. A chip, comprising:
- a core circuit;
- a dynamic random access memory (DRAM) controller, coupled to a DRAM; and
- a serial transmission interface, coupled to another chip;
- wherein when the core circuit intends to store first data and second data, the core circuit stores the first data into the DRAM via the DRAM controller, and transmits the second data to said another chip via the serial transmission interface, such that said another chip stores the second data into another DRAM which is accessible to said another chip;
- wherein when the core circuit intends to read the first data and the second data, the core circuit read the first data from the DRAM via the DRAM controller; and the core circuit transmits a read command to said another chip via the serial transmission interface, wherein the read command comprises an address of the second data, such that said another chip reads the second data from said another DRAM.

13. The chip of claim 12, wherein the first chip simultaneously receives the first data from the DRAM and receives the second data from said another chip during a partially overlapping time period.

* * * * *